United States Patent [19]
Meng

[11] Patent Number: 6,054,879
[45] Date of Patent: Apr. 25, 2000

[54] CURRENT SENSING AMPLIFIER WITH FEEDBACK

[75] Inventor: Anita X. Meng, Milpitas, Calif.

[73] Assignee: Cypress Semiconductor Corp., San Jose, Calif.

[21] Appl. No.: 08/986,440

[22] Filed: Dec. 8, 1997

[51] Int. Cl.[7] ................................ G11C 7/06; H03K 5/12
[52] U.S. Cl. ................... 327/54; 327/51; 327/170
[58] Field of Search .................... 327/51, 54, 55, 327/57, 134, 170, 205, 206; 326/87

[56] References Cited

U.S. PATENT DOCUMENTS

| | | | |
|---|---|---|---|
| 5,148,482 | 9/1992 | Bocci et al. | 327/51 |
| 5,189,322 | 2/1993 | Chan et al. | 327/54 |
| 5,495,191 | 2/1996 | Lev et al. | 327/55 |
| 5,525,917 | 6/1996 | Wong et al. | 327/51 |
| 5,546,026 | 8/1996 | Lin et al. | 327/54 |

*Primary Examiner*—Toan Tran
*Attorney, Agent, or Firm*—Blakely, Sokoloff, Taylor & Zafman LLP

[57] ABSTRACT

A sense amplifier that includes a sensing circuit, a first feedback circuit, and an output buffer. The first feedback circuit is coupled to an output of the sensing circuit and is configured in a feedback arrangement with the output buffer. The output of the sensing circuit provides an output signal having a first slew rate as the output signal transitions from a first logic state to a second logic state. The first feedback circuit may increase the slew rate of the output signal. The sense amplifier may also include a second feedback circuit coupled to the output of the sensing circuit and configured in a feedback arrangement with the output buffer. The second feedback circuit may increase a second slew rate of the output signal as the output signal transitions from the second logic state to the first logic state. The sense amplifier may be a current sense amplifier that may be used to sense the amount of current flowing through a nonvolatile memory circuit.

9 Claims, 4 Drawing Sheets

CURRENT SENSING AMPLIFIER WITH FEEDBACK

FIELD OF THE INVENTION

The present invention relates to sense amplifiers for memory circuits, and more particularly to current sense amplifiers for programmable logic devices.

BACKGROUND

A programmable logic device ("PLD") typically includes an array of programmable elements forming programmable interconnections of signal lines. The programmable elements typically include memory cells such as nonvolatile erasable programmable read only memory ("EPROM") cells, electrically erasable programmable read only memory ("EEPROM") cells, and flash memory cells.

The array of programmable memory cells is tyically organized into a number of rows and columns. Each column or row may have a sense amplifier to sense the state of one or more selected memory cells. For example, FIG. 1 shows a conventional sense amplifier 100 for sensing the state of memory cell 102. Memory cell 102 has a drain coupled to a bit line 104, a source coupled to source line 106, and a select gate coupled to word line 108. Memory cell 102 may be selected for reading by activating word line 108.

A state stored by memory cell 102 may be sensed by sense amplifier 100 as follows. When memory cell 102 is "OFF" (i.e., either programmed or erased depending on the technology), it typically does not provide a conduction path between lines 104 and 106 when word line 108 is activated. The voltage difference maintained between lines 104 and 106 is sufficiently large to turn on transistors 112 and 118 such that node 114 is pulled low. This causes the output of sense amplifier 100 to be high on line 110. When memory cell 102 is "ON" (i.e., either or programmed or erased depending on the technology), it typically provides a conduction path between lines 104 and 106 when word line 108 is activated. The voltage difference on lines 104 and 106 will drop to less than the threshold voltage of transistor 112 causing node 114 to be pulled high and sense amplifier 100 to output a low state on line 110.

The difference in the potential between line 104 and 106 at which sense amplifier 100 can sense a transition of a state of memory cell 102 is generally referred to as the trip point or trip voltage for sense amplifier 100. The speed of sense amplifier 100 is related to how close the voltage difference between lines 104 and 106 is to the trip point. Therefore, one method of increasing the speed or switching time of sense amplifier 100 is to limit the voltage difference between 104 and 106. U.S. Pat. No. 5,525,917 discloses feedback circuitry that limits the voltage swing on lines 104 and 106 to improve the switching speed of a sense amplifier such as sense amplifier 100.

The speed of sense amplifier 100 is also related to the slew rate of the signal at node 114 as it transitions from a high state to a low state or from a low state to a high state. The slew rate of the output signal on line 110 will generally follow the slew rate of the signal at node 114. Therefore, if the slew rate of the signal at node 114 is increased as it transitions from one state to another, the slew rate of the signal on line 110 may similarly increase. Therefore, it is desirable to increase the switching speed of a sense amplifier by increasing the slew rate of a transition of the signal at node 114 and the slew rate of a transition of the output signal at output line 110.

SUMMARY OF THE INVENTION

One embodiment of the present invention concerns a sense amplifier that includes a sensing circuit, a first feedback circuit, and an output buffer. The first feedback circuit is coupled to an output of the sensing circuit and is configured in a feedback arrangement with the output buffer. The output of the sensing circuit provides an output signal having a first slew rate as the output signal transitions from a first logic state to a second logic state. The first feedback circuit may increase the slew rate of the output signal. The sense amplifier may also include a second feedback circuit coupled to the output of the sensing circuit and configured in a feedback arrangement with the output buffer. The second feedback circuit may increase a second slew rate of the output signal as the output signal transitions from the second logic state to the first logic state. The sense amplifier may be a current sense amplifier that may be used to sense the amount of current flowing through a nonvolatile memory circuit.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

A current sensing amplifier with feedback circuitry is disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

As will be described in more detail below, the present invention is a sense amplifier that may be used to sense the state of a memory cell with an improved switching time. The memory cell may be a programmable element included within a PLD. The sense amplifier of the present invention may include a first feedback circuit that increases a first slew rate of the output signal of the sense amplifier as the output signal transitions from a first logic state to a second logic state. The sense amplifier may also include a second feedback circuit that increases a second slew rate of the output signal as the output signal transitions from the second logic state to the first logic state. The sense amplifier may be a current sense amplifier that may be used to sense the amount of current flowing through one or more memory cells.

Figure 2:
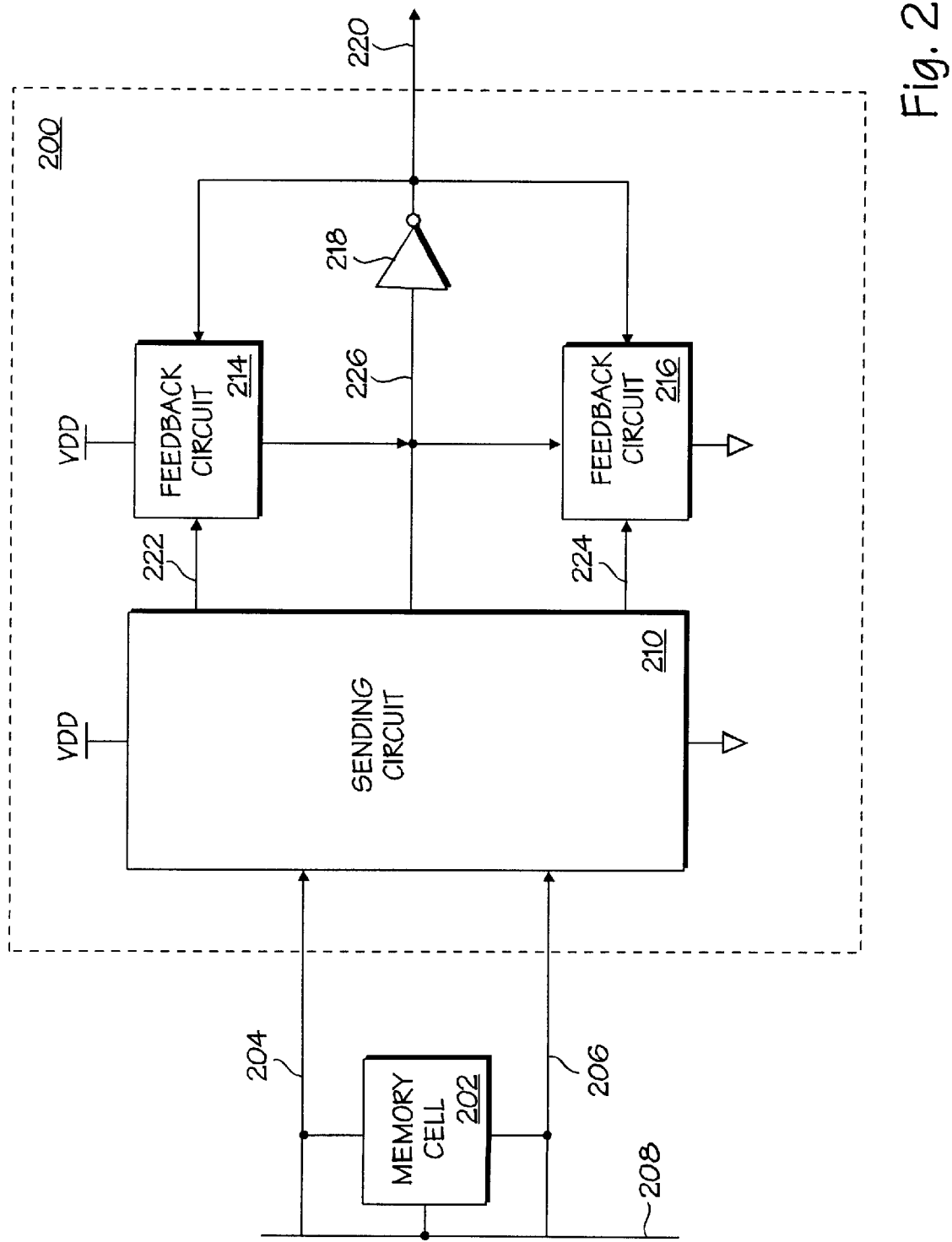
FIG. 2 is one embodiment of the a current sensing amplifier with feedback circuitry according to the present invention.

FIG. 2 shows sense amplifier 200 that is one embodiment of the present invention. Sense amplifier 200 is configured to sense the state of memory cell 202. Memory cell 202 may include an EPROM cell, an EEPROM cell, a flash memory cell, or any other nonvolatile or volatile memory cell.

Memory cell 202 may be for example, an EEPROM cell having a control gate coupled to word line 208, a drain coupled line 204, a source coupled to line 206, and a floating gate for storing charge. Sense amplifier 200 may also sense the state of more than one memory cell coupled to lines 204 and 206.

Sense amplifier 200 includes a sensing circuit 210, a first feedback circuit 214, a second feedback circuit 216, and an output buffer or driver 218. Sensing circuit 210 may sense the state of memory cell 202 by monitoring the voltages on lines 204 and 206. The voltages on lines 204 and 206 may be related to the amount of current flowing through memory cell 202 such that sensing circuit 210 is a current sensing circuit that outputs a voltage signal on line 226 in response the amount of current flowing through memory cell 202.

A state stored by memory cell 202 may be sensed by sense amplifier 200 as follows. When memory cell 202 is "OFF" (i.e., either programmed or erased depending on the technology), it typically does not provide a conduction path between lines 204 and 206 when word line 208 is activated. Without a conduction path between lines 204 and 206, the difference in the voltages on lines 204 and 206 may be relatively greater (e.g., greater than one absolute value of the threshold voltage of an NMOS or PMOS transistor) than when memory cell 202 is "ON" (i.e., either programmed or erased depending on the technology) and memory cell 202 provides a conduction path between lines 204 and 206. With the voltages on lines 204 and 206 relatively far apart, sensing circuit 210 may drive line 226 to a low voltage. At approximately the same time, sensing circuit 210 and output buffer 218 may enable feedback circuit 214 via line(s) 222 and 220, respectively, to prepare to provide additional current capacity when sensing circuit 210 senses a change of state in memory cell 202 (or another memory cell coupled to lines 204 and 206). The additional current capacity may be used to pull line 226 to a high state at a faster slew rate than may be possible by sensing circuit 210 alone.

When sensing circuit subsequently detects that memory cell 202 is "ON", a conduction path may exist between lines 204 and 206 when word line 108 is activated. The voltage difference on lines 204 and 206 may be sufficiently small (e.g., less than one absolute value of the threshold voltage of an NMOS or PMOS transistor) relative to when memory cell 202 is "OFF", such that sensing circuit 210 may transition line 226 from a low state to a high state. Feedback circuit 214 may also provide additional current capacity to assist sensing circuit 210 in transitioning line 226 from a low state to a high state at a faster slew rate than when sensing circuit 210 is driving line 226 alone. In response to the low-to-high transition of the signal on line 226, output buffer or inverter 218 may drive output line 220 from a high state to a low state at a slew rate that is faster than the slew rate of sense amplifier 200 without feedback circuit 214.

The output signal on line 220 may be coupled to feedback circuit 214 to cause feedback circuit 214 to be disabled from providing additional current capacity to line 226 after a sufficient amount of time has transpired. During this time, the signals on lines 226 and 220 may stabilize. Thus, feedback circuit 214 may be enabled for a period of time to provide additional current capacity when pulling the signal on line 226 from a low state to a high state, and feedback circuit 214 may then be disabled from driving line 226 when the extra drive capacity is not required (i.e., when the voltage on line 226 has stabilized to a high state). This may enable the driving circuit of sensing circuit 210 to be designed with smaller transistor geometries than in previous designs, which may result in reduced capacitance on line 226. Reducing the capacitance on line 226 may further increase the slew rate of the signal transitions on lines 226 and 220. The increased slew rate of the low-to-high transition of the signal on line 226 (as compared to without feedback circuit 216) may also decrease the power consumed by sense amplifier 200 during the signal transition (i.e., reduce the crow-bar current).

The output signal on line 220 may also be coupled to feedback circuit 216. Sensing circuit 210 and output buffer 218 may enable feedback circuit 216 via line(s) 224 and 220, respectively, to prepare to provide additional current capacity when sensing circuit 210 senses a change of state in memory cell 202 (or another memory cell coupled to lines 204 and 206). The additional current capacity may be used to pull line 226 to a low state at a faster slew rate than may be possible by sensing circuit 210 alone.

When sensing circuit subsequently detects that memory cell 202 is "OFF", a conduction path may not exist between lines 204 and 206 when word line 108 is activated. The voltage difference on lines 204 and 206 may be sufficiently large (e.g., greater than one absolute value of the threshold voltage of an NMOS or PMOS transistor) relative to when memory cell 202 is "ON", such that sensing circuit 210 may transition line 226 from a high state to a low state. Feedback circuit 216 may also provide additional current capacity to assist sensing circuit 210 in transitioning line 226 from a high state to a low state at a faster slew rate than when sensing circuit 210 is driving line 226 alone. In response to the high-to-low transition of the signal on line 226, output buffer or inverter 218 may drive output line 220 from a low state to a high state at a slew rate that is faster than the slew rate of sense amplifier 200 without feedback circuit 216.

The output signal on line 220 may be coupled to feedback circuit 216 to cause feedback circuit 216 to be disabled from providing additional current capacity to line 226 after a sufficient amount of time has transpired. During this time, the signals on lines 226 and 220 may stabilize. Thus, feedback circuit 216 may be enabled for a period of time to provide additional current capacity when pulling the signal on line 226 from a high state to a low state, and feedback circuit 216 may then be disabled from driving line 226 when the extra drive capacity is not required (i.e., when the voltage on line 226 has stabilized to a low state). This may enable the driving circuit of sensing circuit 210 to be designed with smaller transistor geometries than in previous designs, which may result in reduced capacitance on line 226. Reducing the capacitance on line 226 may further increase the slew rate of the signal transitions on lines 226 and 220. The increased slew rate of the high-to-low transition of the signal on line 226 (as compared to without feedback circuit 216) may also decrease the power consumed by sense amplifier 200 during the signal transition (i.e., reduce the crow-bar current).

The increased slew rates on lines 226 and 220 may decrease the switching time (i.e., the time from the voltage on word line 208 transitioning states to the signal on line 220 transitions states) of sense amplifier 200. For one embodiment, the slew rate of the signal transitions on lines 226 and/or 220 may be increased from approximately 50% to 100% or more over a design without feedback circuits 214 or 216. The switching time of sense amplifier may also decrease (i.e., become faster) by approximately 10% to approximately 50% or more over a design without feedback circuits 214 or 216. For one embodiment, the switching time of sense amplifier 200 may decrease from approximately 2.8 to 3.2 nanoseconds (ns) without feedback circuits 214 or 216 to approximately 1.8 to 2.2 ns with feedback circuit 214 and/or 216.

For one embodiment, feedback circuits 214 and 216 may also adjust the amount of cell current flowing through memory cell 202 that is required to reach the trip point or trip voltage to transition sense amplifier 200. For example, feedback circuit 214 may enable the high-to-low transition of the output signal on line 220 to occur when a smaller amount of cell current (e.g., I1 of FIG. 4) flows through memory cell 202 than that required for memory cell 102 (e.g., IPA of FIG. 4) of FIG. 1. That is, sense amplifier 200 may transition from a high-to-low state earlier and with less memory cell current than the memory cell current of sense amplifier 100 of FIG. 1. Similarly, feedback circuit 216 may enable the low-to-high transition of the output signal on line 220 to occur when a larger amount of cell current (e.g., I2 of FIG. 4) flows through memory cell 202 than that required for memory cell 102 (e.g., IPA of FIG. 4) of FIG. 1. That is, sense amplifier 200 may transition from a low-to-high state earlier than sense amplifier 100 of FIG. 1.

Figure 3:
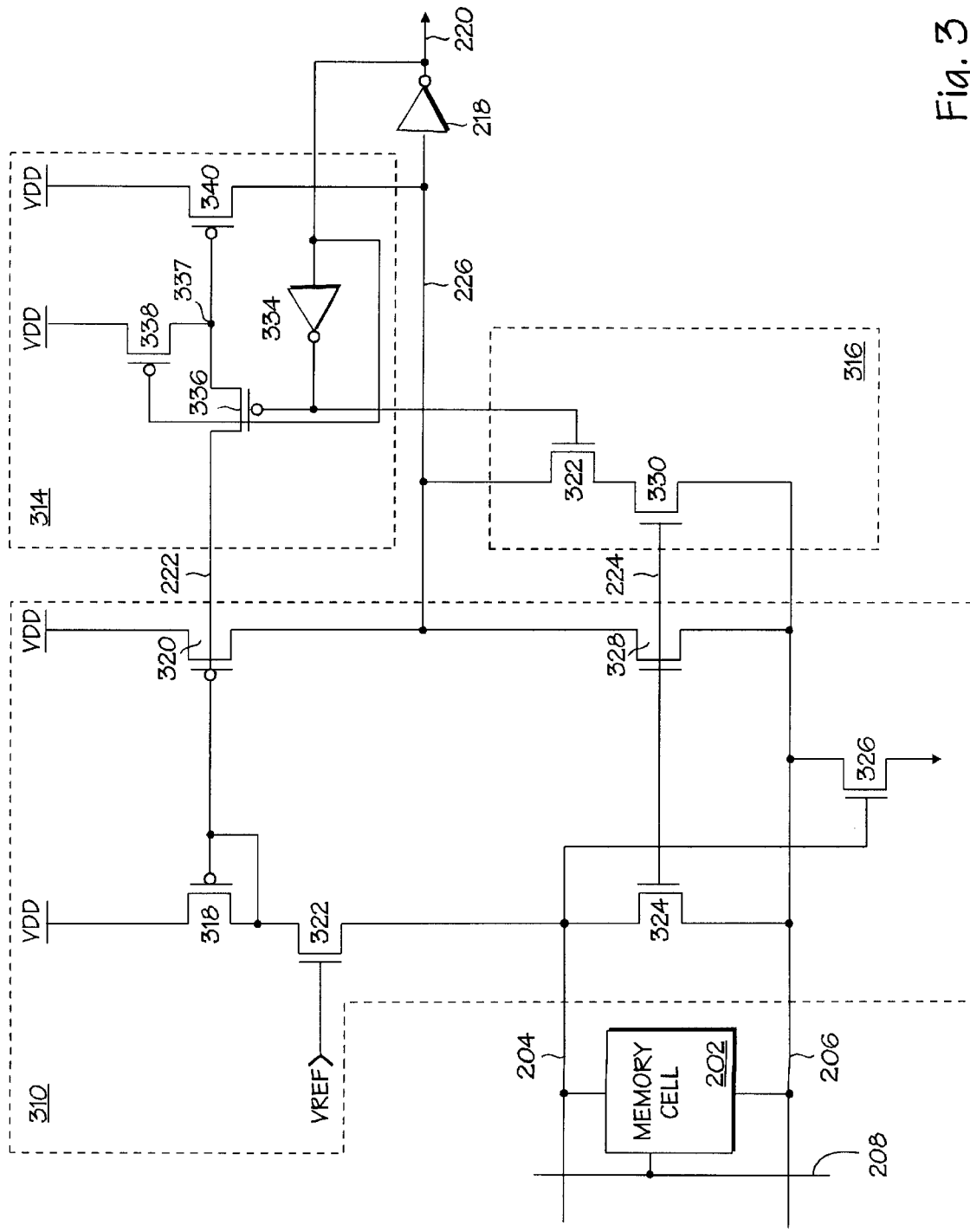
FIG. 3 is another embodiment of a current sensing amplifier with feedback circuitry according to the present invention.

FIG. 3 shows one embodiment of sense amplifier 200 that includes sensing circuit 310, feedback circuit 314, and feedback circuit 316. Sensing circuit 310 is one embodiment of sensing circuit 210, feedback circuit 314 is one embodiment of feedback circuit 214, and feedback circuit 316 is one embodiment of feedback circuit 216 of FIG. 2.

Sensing circuit 310 may include PMOS transistors 318 and 320, and NMOS transistors 322, 324, 326, and 328. Transistors 318 and 320 may be configured as a current mirror for providing a controlled current and voltage to line 226. Transistor 318 has its source coupled to a first power supply rail VDD (e.g., approximately 3 volts to approximately 7 volts), and its drain coupled to its gate, the gate of the transistor 320, and the drain of transistor 322. Transistor 322 may be coupled in cascode with its gate coupled to a reference voltage VREF, and its source coupled to line 204 and the drain of transistor 324. Transistor 322 may control the amount of current flowing through the current mirror formed by transistors 318 and 320 in response to VREF. For one embodiment, VREF may be greater than or equal to twice the threshold voltage of NMOS transistors 322, 324, 328, or 326. For example, VREF may be from approximately 1.8 volts to approximately 2.6 volts. VREF may be generated by any voltage generating circuit. Transistor 324 has its drain coupled to line 204, its gate coupled to its drain, and its source coupled to line 206. Transistor 328 has its gate coupled to the gate of transistor 324, its drain coupled to line 226, and its source coupled to line 206. Transistor 326 has its drain coupled to line 206, its gate coupled to line 204, and its source coupled to a second power supply rail (e.g., ground or approximately zero volts).

Feedback circuit 314 may include inverter 334, CMOS transmission gate 336, and PMOS transistors 338 and 340. Inverter 334 has an input coupled to line 220 and an output coupled to the PMOS gate terminal of CMOS transmission gate 336. CMOS transmission gate 336 has one terminal coupled to the gates of transistors 318 and 320 via line 222, a second terminal coupled to node 337, an NMOS gate terminal coupled to line 220, and a PMOS gate terminal coupled to the output of inverter 334. CMOS transmission gate 336 may alternatively be replaced by an NMOS pass gate, a PMOS pass gate or another transmission element. Transistor 338 has its source coupled to the first power supply rail, its gate coupled to line 220, and its drain coupled to node 337. Transistor 340 has its source coupled to the first power supply rail, its gate coupled to node 337, and its drain coupled to line 226.

Feedback circuit 316 may include NMOS transistors 330 and 332. Transistor 332 has its drain coupled to line 226, its gate coupled to the output of inverter 334, and its source coupled to the drain of transistor 330. Transistor 330 has its gate coupled to the gates of transistors 324 and 328 via line 224, and its source coupled to line 206. While inverter 334 is illustrated as a part of feedback circuit 314, it will be appreciated that inverter 334 may also be considered a part of feedback circuit 316. Additionally, and/or alternatively, one or more buffers or inverters may also be included between inverters 218 and 334.

As will be described below, feedback circuits 314 and 316 may operate to increase the slew rate of the low-to-high and high-to-low signal transitions, respectively, of the signal on line 226. As a result, the slew rates of the signal transitions for the output signal on line 220 may also be increased over a sense amplifier without feedback circuits 314 and 316. The increased slew rates may result in increased switching times for the sense amplifier.

The operation of the sense amplifier shown in FIG. 3 may be described as follows. Assume that initially memory cell 202 is "OFF" or in a non-conducting state. In this state, sensing circuit 310 may drive line 226 to a low state via transistors 326 and 328, and output line 220 may be driven to a high state by driver 218. In this initial state, feedback circuit 316 may be disabled from driving line 226 because inverter 334 may couple a low state to the gate of transistor 332. Thus, transistor 332 may be off such that transistor 330 is decoupled from line 226. In this initial state, feedback circuit 314 may be enabled to precondition or prepare the sense amplifier to quickly pull the signal on line 226 to a high state when an "ON" or conducting state is subsequently sensed from memory cell 202. When feedback circuit 314 is enabled, inverter 334 may couple a low state to the PMOS gate terminal of CMOS transmission gate 336 and a high state to the NMOS gate terminal of CMOS transmission gate 336 such that transistor 340 may be turned on. Thus, in this initial state, transistors 320 and 340 may be on, but transistors 328 may also be on such that line 226 is maintained at a low state.

Transistor 328 may be sized to be relatively small (e.g., approximately 10% to 50% smaller than conventional designs) in comparison to typical conventional designs of sensing circuit 310 because transistor 328 may be primarily used to maintain the low state on line 226. In conventional designs, transistor 328 may have been sized relatively large because it was the only means used to pull line 226 to a low state. For one embodiment, transistor 328 has a width-to-length ratio of approximately 4 microns ($\mu$m) to approximately 0.5 $\mu$m. Other geometries may be used. The reduced size of transistor 328 may also reduce the amount of parasitic capacitance that is contributed to line 226 by transistor 328. The reduced parasitic capacitance may aide in increasing the slew rate (relative to conventional larger geometry designs) of the signal on line 226 as it transitions from a low state to a high state.

When a subsequent "ON" or conducting state is sensed in memory cell 202, a conductive path exists between lines 204 and 206. The conductive path reduces the voltage difference between lines 204 and 206 until the voltage difference turns off transistor 328 (e.g., less than or equal to approximately 0.7 volts to approximately 1.4 volts). When transistor 328 is turned off, transistors 320 and 340 may quickly pull line 226 from a low state to a high state. After a delay through inverters 218 and 334, CMOS transmission gate 336 may be disabled and transistor 340 disabled by transistor 338. When transistor 340 is disabled, the additional current capacity of feedback circuit 314 may be disabled. Thus, transistor 340 may provide additional current capacity to help transistor 320 pull up line 226 towards the first power supply rail for a period of time sufficient to allow the signal on line 226 and/or the signal on line 220 to stabilize (e.g., approximately 1 ns to approximately 3 ns). The period of time may be determined by the delay through inverters 218 and 334. For alternative embodiments, additional inverter and/or buffer circuits may be coupled between inverters 218 and 334.

Transistors 320 and 340 may have any geometries relative to each other. For one embodiment, transistor 340 may be sized to have a larger current capacity than transistor 320 such that transistor 340 provide the majority of the pull-up capability, while transistor 320 may be primarily used to maintain a high state on line 226 when transistor 340 is turned off (i.e., when feedback circuit 314 is disabled). Transistor 320 may be sized to be relatively small (e.g., approximately 10% to 50% smaller than conventional designs) in comparison to typical conventional designs of sensing circuit 310. In conventional designs, transistor 320 may have been sized relatively large because it was the only means used to pull line 226 to a high state. The reduced size of transistor 320 may also reduce the amount of parasitic capacitance that is contributed to line 226 by transistor 320. The reduced parasitic capacitance may aide in increasing the slew rate (relative to conventional larger geometry designs) of the signal on line 226 as it transitions from a high state to a low state. For one embodiment, transistor 320 may have a width-to-length ratio of approximately 3.0 $\mu$m to approximately 1.0 $\mu$m, and transistor 340 may have a width-to-length ratio of approximately 3.5 $\mu$m to approximately 0.5 $\mu$m. Other geometries may be used.

For one embodiment, the slew rate of a low-to-high transition on line 226 may be from approximately 500 picoseconds (ps) to approximately 1.5 nanoseconds (ns) for approximately a 3 to 7 volt transition. This increase in the slew rate of the low-to-high transition of the signal on line 226 may cause a corresponding slew rate increase for the signal on line 220 such that the switching speed of the sense amplifier shown in FIG. 3 may be increased over that of the sense amplifier of FIG. 1. For example, the switching speed of the sense amplifier of FIG. 3 may be approximately 1.5 to approximately 2.2 ns as compared to the sense amplifier of FIG. 1 with a switching speed of approximately 2.8 to approximately 3.2 ns.

The increase in the slew rate of the low-to-high transition of the signal on line 226 and the high-to-low transition of the signal on line 220 may cause the power drawn during switching to be less than that of a sense amplifier without feedback circuit 314. That is, the sense amplifier of FIG. 3 may draw current for a reduced period of time during switching relative to conventional sense amplifiers without feedback circuit 314.

Feedback circuit 316 may be enabled after the period of time introduced by inverters 218 and 334. Feedback circuit 316 may be enabled by inverter 334 turning on transistor 332. When transistor 332 is enabled, feedback circuit 316 may be enabled to precondition or prepare the sense amplifier to quickly pull the signal on line 226 to a low state when an "OFF" or non-conducting state is subsequently sensed from memory cell 202. Transistor 332 may be sized to be relatively small so as to couple a small amount of parasitic capacitance to line 226. For one embodiment, the width-to-length ratio of transistor 332 may be approximately 3 gm to approximately 1gm. Other geometries may be used.

When a subsequent "OFF" or non-conducting state is sensed in memory cell 202, a conductive path may not exist between lines 204 and 206. VREF may pull line 204 towards to VREF minus a threshold voltage of 322, and transistor 326 may pull line 206 towards the second power supply rail thus increasing the voltage differential between lines 204 and 206. When the voltage difference between lines 204 and 206 reaches the threshold of transistors 328 and 330 (e.g., approximately 0.6 volts to approximately 1.4 volts) transistors 328, 330, 332, and 326 may conduct and pull line 226 towards the second power supply rail. After a delay through inverters 218 and 334, transistor 332 will be disabled such that transistor 330 may be decoupled from line 226. Thus, feedback circuit 316 may be enabled for an amount of time sufficient (e.g., approximately 1 ns to approximately 3 ns) to increase the current capacity of the sense amplifier and enable line 226 to be pulled from a high logic state to a low logic state by transistors 326, 328, 330, and 332 rather than just transistors 326 and 328. The period of time may be determined by the delay through inverters 218 and 334. For alternative embodiments, additional inverter and/or buffer circuits may be coupled between inverters 218 and 334.

For one embodiment, the high-to-low transition on line 226 may be from approximately 500 ps to approximately 1 ns for approximately a 3 to 7 volt transition. This increase in the slew rate of the high-to-low transition of the signal on line 226 may cause a corresponding slew rate increase for the signal on line 220 such that the switching speed of the sense amplifier shown in FIG. 3 may be increased over that of the sense amplifier of FIG. 1. For example, the switching speed of the sense amplifier of FIG. 3 may be approximately 1.5 to approximately 2.2 ns as compared to the sense amplifier of FIG. 1 with a switching speed of approximately 2.8 to approximately 3.2 ns.

Figure 1:
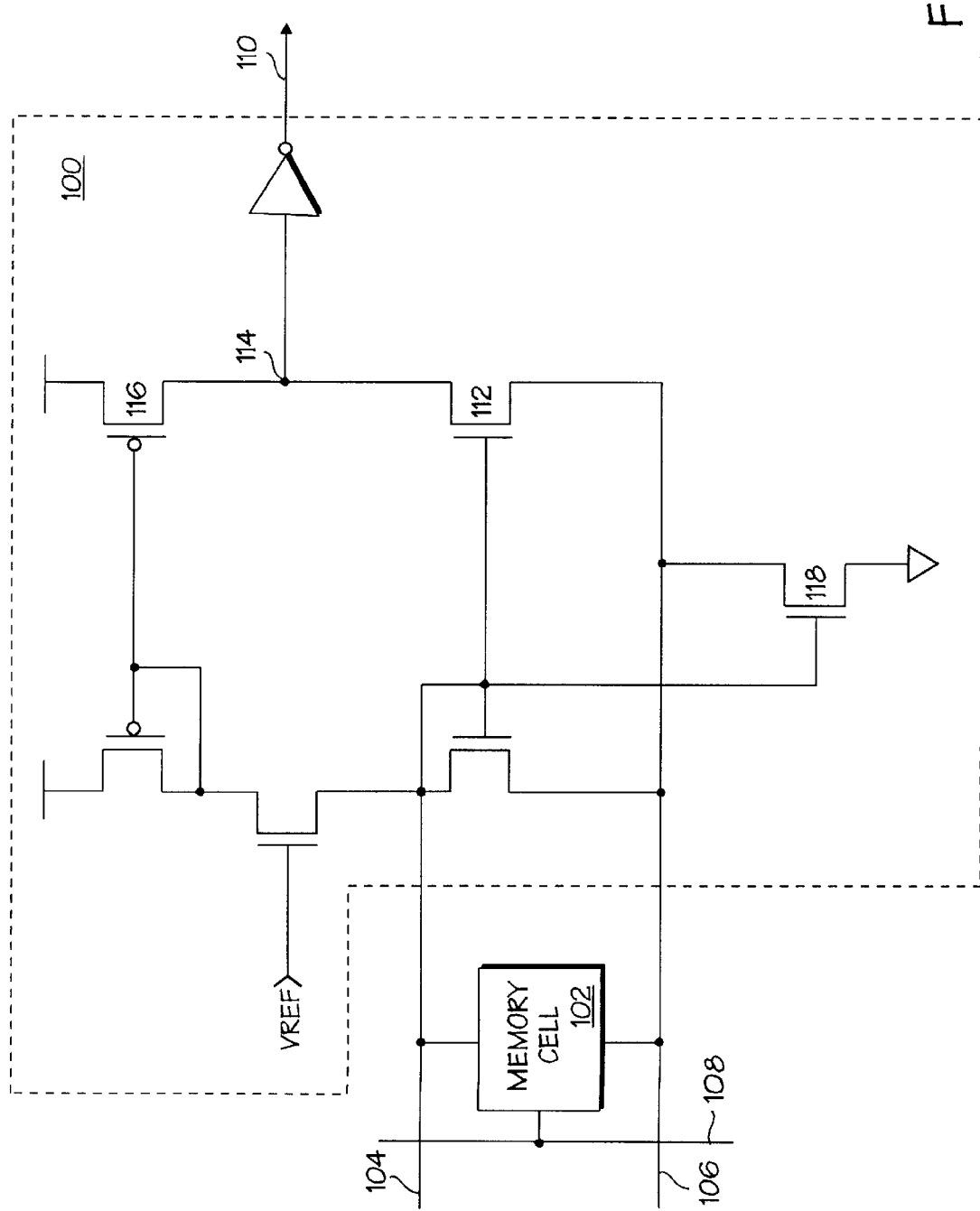
FIG. 1 is a conventional current sensing amplifier.

With an increase in the high-to-low slew rate of the signal on line 226, the crow-bar current drawn by the sense amplifier of FIG. 3 may be reduced relative to sense amplifier 100 of FIG. 1. For example, sense amplifier 100 may dissipate crow-bar current for approximately 3 ns during a high-to-low transition on line 114, while the sense amplifier of FIG. 3 may dissipate crow-bar current for approximately 1 ns or less during a high-to-low transition on line 226. Thus, the sense amplifier of FIG. 3 may draw as little as one-third the amount of current drawn by sense amplifier 100 of FIG. 1.

Transistor 330 may be sized in any ratio relative to transistors 328 and 332. For one embodiment, transistor 330 may be sized relatively large in comparison to transistors 328 and 330. For this embodiment, transistor 330 may provide a large current capacity when pulling line 226 towards the second power supply rail, and transistors 332 and 328 may couple a relatively lower parasitic capacitance to line 226 than transistor 330. For one embodiment, the width-length-ratio of transistor 330 may be greater than that of transistors 328 and 332 by a factor of approximately 3 to 6. For one embodiment, the width-to-length ratio of transistor 330 may be approximately 20 $\mu$m to approximately 0.5 $\mu$m.

Figure 4:
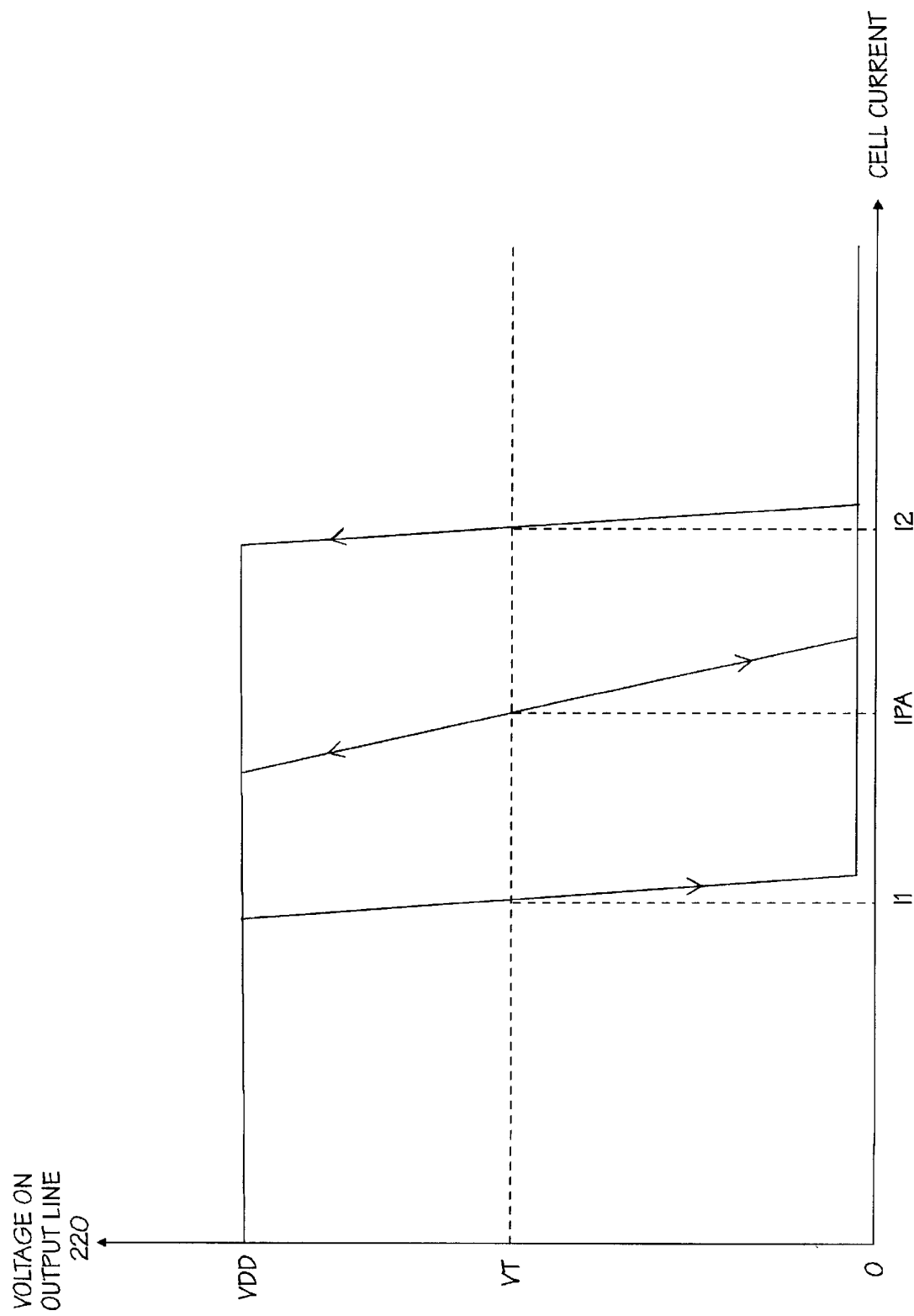
FIG. 4 is an illustrative graph of output voltage vs. memory cell current for the current sensing amplifier of FIG. 3.

For one embodiment, the sizing of transistors 320, 340, 328, 330, and 332 may enable the switching speed of the sense amplifier of FIG. 3 to be increased further relative to sense amplifier 100 of FIG. 1. With reference to FIGS. 1 and 4, the output signal on line 220 will change state (high-to-low or low-to-high) when a predetermined amount of current IPA flows through memory cell 102. The voltage VT at which the state transition occurs is the trip point or trip voltage of the sense amplifier (e.g., one-half of, or another percentage of, the first power supply rail voltage). For one embodiment, IPA may be approximately 80 microAmperes ($\mu$A) when transistor 116 has a width-to-length ratio of approximately 7 μm to approximately 1 μm, and transistor 112 has a width-to-length ratio of approximately 25 μm to approximately 0.5 μm.

With reference to FIGS. 3 and 4, different amount of currents flowing through memory cell 202 may cause the sense amplifier of FIG. 3 to transition states. For example, as previously described above, transistors 320, 328, and 340 are on when line 226 is low and line 220 is high. That is, there is relatively a large equivalent PMOS transistor coupled to a relatively small NMOS transistor. When memory cell 202 turns on or is conductive, the sense amplifier of FIG. 3 will transition states when a current of I1 flows through memory cell 202. I1 may be less than IPA such that the sense amplifier of FIG. 3 reaches VT sooner (e.g., approximately 500 ps to approximately 3 ns earlier) and switches states earlier (e.g., approximately 500 ps to approximately 3 ns earlier) than sense amplifier 100 of FIG. 1. For one embodiment, I1 may be approximately 30 microAmperes (μA) when transistor 320 has a width-to-length ratio of approximately 3.0 μm to approximately 1 μm, transistor 328 has a width-to-length ratio of approximately 4 μm to approximately 1 μm, and transistor 340 has a width-to-length ratio of approximately 7 μum to approximately 1 μm. Other geometries may be used.

Similarly, as previously described above, transistors 320, 328, 330, and 332 are on after line 220 transitions from a high state to a low state. That is, there is relatively a large equivalent NMOS transistor coupled to a relatively small PMOS transistor at line 226. When memory cell 202 turns off or is non-conductive, the sense amplifier of FIG. 3 will transition states when a current of I2 flows through memory cell 202. I2 may be greater than I1 and IPA such that the sense amplifier of FIG. 3 reaches VT sooner (e.g., approximately 500 ps to 3 ns earlier) and switches states earlier (e.g., approximately 500 ps to 3 ns earlier) than sense amplifier 100 of FIG. 1. For one embodiment, I2 may be approximately 120 microAmperes (μA) when transistor 320 has a width-to-length ratio of approximately 3.0 μm to approximately 1 μm, transistor 328 has a width-to-length ratio of approximately 4 μm to approximately 1 μm, transistor 330 has a width-tolength ratio of approximately 20 μm to approximately 0.5 μm, and transistor 332 has a width-to-length ratio of approximately 3 μm to approximately 0.5 μm. Other geometries may be used.

For alternative embodiments, the sense amplifiers of FIGS. 2 and/or 3 may include only one of the feedback circuits. For example, only feedback circuit 314 may be used in FIG. 3 to increase the slew rate of a low-to-high transition of the signal on line 226 and, consequently, the switching speed of the sense amplifier. Alternatively, only feedback circuit 316 may be used in FIG. 3 (together with inverter 334) to increase the slew rate of a high-to-low transition of the signal on line 226 and, consequently, the switching speed of the sense amplifier.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A sense amplifier comprising:

a sensing circuit having a first output to provide a sensed output signal and a second output to provide a feedback circuit enablement signal;

a buffer having an input coupled to the first output of the sensing circuit and a buffer output to provide a buffer output signal;

a first feedback circuit coupled in a feedback arrangement with the buffer and having an input to receive the buffer output signal and the feedback circuit enablement signal from the second output of the sensing circuit, the feedback circuit enablement signal to enable the first feedback circuit to affect a first slew rate of the sensed output signal as the sensed output signal transitions from a first logic state to a second logic state.

2. The sense amplifier of claim 1, wherein the first feedback circuit comprises:

a first transistor having a first terminal coupled to the first output of the sensing circuit, and a second terminal;

a second transistor having a first terminal coupled to the second terminal of the first transistor and a second terminal coupled to the output of the output buffer; and a third transistor having a first terminal coupled to the second terminal of the first transistor, and a second terminal coupled to the second output of the sensing circuit.

3. The sense amplifier of claim 2, wherein the first feedback circuit further comprises an inverter coupled to the output of the output buffer and a third terminal of the third transistor.

4. The sense amplifier of claim 1, further comprising a second feedback circuit coupled in a feedback arrangement with the output buffer, and having an input to receive a second feedback circuit enablement signal, the second feedback circuit enablement signal to enable the second feedback circuit to affect a second slew rate of the first output signal as the first output signal transitions from the second logic state to the first logic state.

5. The sense amplifier of claim 4, wherein the second feedback circuit comprises:

a first transistor coupled to the first output of the sensing circuit and the output of the output buffer; and a second transistor coupled to the first transistor and a third output of the sensing circuit.

6. The sense amplifier of claim 5, wherein the second feedback circuit further comprises an inverter coupled between the output of the output buffer and the first transistor.

7. The sense amplifier of claim 1, wherein the sensing circuit is configured to sense current flowing through a memory circuit.

8. The sense amplifier of claim 1, wherein the sensing circuit comprises:

a current mirror coupled to the first and second outputs of the sensing circuit;

a first transistor coupled to the current mirror, a reference voltage, and a first input of the sensing circuit;

a second transistor coupled to the first input of the sensing circuit and a second input of the sensing circuit;

a third transistor coupled to the first input of the sensing circuit and the second input of the sensing circuit; and a fourth transistor coupled to the first input of the sensing circuit, the second input of the sensing circuit, and the first output of the sensing circuit.

9. A sense amplifier circuit comprising:

means for sensing the state of a memory circuit and for generating (1) a signal corresponding to the state of the memory circuit; and (2) a first enabling signal; and means for affecting a first slew rate of the signal in response to the first enabling signal as the signal transitions from a first logic state to a second logic state, wherein the sensing and generating means further comprises means for generating a second enabling signal, and the sense amplifier further comprises means for affecting a second slew rate of the signal in response to the second enabling signal as the signal transitions form the second logic state to the first logic state.

* * * * *